United States Patent [19]

Hara et al.

[11] Patent Number: 4,999,688

[45] Date of Patent: Mar. 12, 1991

[54] OPTICAL LOGIC ELEMENT WITH SHORT SWITCHING TIME

[75] Inventors: Kunihiko Hara; Keisuke Kojima; Kazuo Kyuma, all of Amagasaki, Japan

[73] Assignee: Mitsubishi Denki Kabushiki Kaisha, Japan

[21] Appl. No.: 475,994

[22] Filed: Jan. 6, 1990

[30] Foreign Application Priority Data

| Feb. 17, 1989 [JP] | Japan | 1-38696 |
| Jul. 10, 1989 [JP] | Japan | 1-177823 |
| Aug. 18, 1989 [JP] | Japan | 1-213841 |

[51] Int. Cl.$^5$ .......................................... H01L 31/12
[52] U.S. Cl. ........................................ 357/19; 357/30; 357/32; 357/38; 357/17; 357/51; 307/117
[58] Field of Search ............... 357/51, 19, 17, 30 P, 357/30 H, 30 I, 30 G, 32, 38 LA, 38; 307/117

[56] References Cited

U.S. PATENT DOCUMENTS

| 3,656,032 | 4/1972 | Henish | 357/30 P X |
| 4,649,409 | 3/1987 | Roppongi et al. | 357/30 P |
| 4,841,164 | 6/1989 | Basso | 307/117 |
| 4,899,204 | 2/1990 | Rosen et al. | 357/32 X |

OTHER PUBLICATIONS

Earhat et al, "Optical Implementation . . . Model", Applied Optics, vol. 24, No. 10, May 1985, pp. 1469–1475.
Taylor et al, "A New Double . . . Beam Epitaxy", Journal of Applied Physics 59(2), Jan. 1986, pp. 596–600.
"Nikkei Microdevices", Mar. 1989, pp. 123–129, no Author.
Ito et al, "Carrier–Injection–Type Optical Switch in GaAs with a 1.06–1.55 μm Wavelength Range", *Appl. Phys. Lett.*, 54(2), Jan. 9, 1989, pp. 134–136.
Grekhov et al, "Some New Possibilities of Fast Switching of Large-Area P-N-P-N Structures," *Sov. Phys. Semicond.*, vol. 10, No. 2, Feb. 1976, pp. 206–208.
Farhat et al, "Optical Implementation of the Hopfield Model," *Applied Optics*, vol. 24, No. 10, May 15, 1985, pp. 1469–1475.
No Author, "Nikkei Microdevices," Mar. 1989, pp. 123–129.
Taylor et al, "A New Double Heterostructure Optoelectronic Switching Device Using Molecular Beam Epitaxy," *J. Appl. Phys.* 59(2), Jan. 15, 86, 596–600.

*Primary Examiner*—William Mintel
*Attorney, Agent, or Firm*—Leydig, Voit & Mayer

[57] ABSTRACT

An optical logic element includes an optical bistable npnp element for switching from a high resistance state to a low resistance state in response to electrical bias and incident light energy in which the switching time becomes shorter as the incident light energy becomes larger. The elements emit light in the low resistance on state. The optical logic element is designed for analog threshold processing of light energy. A plurality of optical bistable elements connected in parallel differentially threshold process incident light energy. An optoelectronic conversion apparatus includes linear arrays of light emitting elements, a two-dimensional array of optical memories, i.e., optical bistable elements, and linear light receiving element arrays arranged transverse to the light emitting element arrays, all integrated with each other. Corresponding light emitting elements, optical memories, and light receiving elements permit arbitrary transfers of signals. Periodic refresh light pulses maintain each optical memory in an established state.

9 Claims, 12 Drawing Sheets

OPTICAL LOGIC ELEMENT WITH SHORT SWITCHING TIME

FIELD OF THE INVENTION

The present invention relates to an optical information processing apparatus, and, more particularly to an optical logic element, a differential type optical switch, and a driving method therefor suitable for a neural network, and an opto-electronic conversion apparatus and an optical vector operation apparatus suitable for parallel information processing system and a parallel information communication system.

BACKGROUND OF THE INVENTION

FIG. 17 shows a prior art logic circuit for analog threshold processing, disclosed in pp 123 to 129 of "Nikkei Micro devices (March, 1989)". In FIG. 17, reference numeral 36 denotes a current outputting type differential amplifier and reference numeral 37 denotes a resistor having a resistance $R_{37}$.

FIG. 18 shows the amplifier 36. In FIG. 18, reference numeral 38 denotes a current mirror circuit, reference numeral 39 denotes a transistor, reference numeral 40 denotes resistors having resistances $R_{40}$, and reference numerals 41 and 42 denote constant current sources having current values $2I_i$ and $I_i$.

The device will operate as follows.

First of all, operation of the amplifier 36 will be described. The minus input terminal is grounded. When the input at the plus terminal is zero, only current as large as $I_i$ flows as $I_{39}$. When a positive voltage is input to the plus terminal, the current $I_{39}$ becomes large in proportion to I, and when it becomes $2I_i$, the current is saturated. Current $I_{40}$ is the same current as $I_{39}$ due to the function of the current mirror circuit 38, and only a current as large as $I_{40}-I_i$ flows as $I_{out}$. The operation when the input to the plus terminal is a negative voltage is the same. From the above, the relation between the plus input $V_{in}$ and the output current $I_{out}$ is as shown in FIG. 19. This configuration is established by varying the values of $R_{40}$ and $I_i$.

The operation of the circuit of FIG. 17 will be described. The current $I_{37}$ flowing through the resistor $R_{37}$ is equal to the sum of the output currents of the amplifiers 36 and the voltage $V_{out}$ is $R_{37} \times I_{37}$. Therefore, when the values $R_{40}$ and $I_i$ of the amplifiers are properly established, an input versus output relation of a line segment configuration, as shown in FIG. 20, is obtained. This represents a threshold processing function having an analog value as an output.

This prior art logic element for analog threshold processing includes a large number of parts and is not appropriate for integration, whereby high speed operation is impossible.

SUMMARY OF THE INVENTION

It is an object of the present invention to provide an optical logic element for analog threshold processing of light energy including a small number of parts, easily monolithically integrated and appropriate for parallel processing in a neural network.

It is a second object of the present invention to provide an optical logic element for differential threshold processing of light energy or power.

It is a third object of the present invention to provide a driving method for a differential type optical logic element for high speed operation at low input light power.

It is a fourth object of the present invention to provide an opto-electronic conversion apparatus for randomly converting, both in space and time a time sequential input signal using such optical logic element and an optical information processing apparatus including an optical vector operation apparatus for processing time sequential input vectors.

Other objects and advantages of the present invention will become apparatus from the detailed description given hereinafter. It should be understood, however, that the detailed description and specific embodiments are given by way of illustration only, since various changes and modifications within the spirit and scope of the invention will become apparent from the detailed description.

According to a first aspect of the present invention, an optical logic element includes an optical bistable element which receives light energy as an input and output light for switching from a high resistance state to a low resistance state in response to light energy and having a switching time that becomes shorter as the input light energy becomes larger for analog threshold processing of input light energy by making the operation time range of the light bistable element a finite value. Therefore, as the input power becomes larger, the light outputting time of the element becomes larger so that the output energy becomes saturated at a certain value or continuously has values between the low and high saturation values.

According to a second aspect of the present invention, a differential type optical logic element is provided with a plurality of optical bistable elements connected in parallel for switching from a high resistance state to a low resistance state and having a switching time which becomes shorter as the input light power becomes larger, and an electrical resistance connected in series with the plurality of optical bistable elements and differential threshold processing is carried out with light energy as both input and output information. Therefore, when an optical bistable element is turned on, the electric resistance functions as a voltage drop, and only the optical bistable element having the largest input power is switched on to emit light. Accordingly, a differential type optical switch for differential processing of input light energy with a small number of parts is obtained.

According to a third aspect of the present invention, a driving method of a differential type optical logic element comprises applying a voltage in excess of a switching voltage to the differential type optical logic element of the above described construction along with inputting light to the respective elements. Therefore, the switching voltage of the pnpn structure is lowered by the light. As the input light power becomes larger, the amount of the reduction of the switching voltage becomes larger. Since differential switching is achieved by applying a voltage in excess of switching voltage (which voltage is that obtained when the input light power is zero), the input light energy can be made quite low. Furthermore, the switching is electric and high speed operation is achieved at a low input light power.

According to a fourth aspect of the present invention, an optical information processing apparatus includes an opto-electronic conversion apparatus or an optical vector operation apparatus which include a line type light emitting element array, a two dimensional matrix array of optical memories comprising optical bistable elements for switching from a high resistance state to a low resistance state in response to light energy and having a switching time which becomes shorter as the input light energy becomes large, and a line type light receiving array arranged in a direction perpendicular to, i.e., transverse to, the light emitting element array, all being laminated on a substrate and integrated with each other. Therefore, opto-electronic conversion that is random in both space and time for a time input signal is achieved. Furthermore, because it is integrated on a substrate, a small-sized and stable apparatus for interchange of a large number of signals is obtained.

BRIEF DESCRIPTION OF THE DRAWINGS

FIG. 10 is a graph of the current versus voltage characteristics when one of pnpn structure semiconductor elements of the differential type optical logic element of FIG. 8 is switched on;

DETAILED DESCRIPTION OF THE PREFERRED EMBODIMENTS

An embodiment of the present invention will be described in detail with reference to the drawings.

Figure 1:
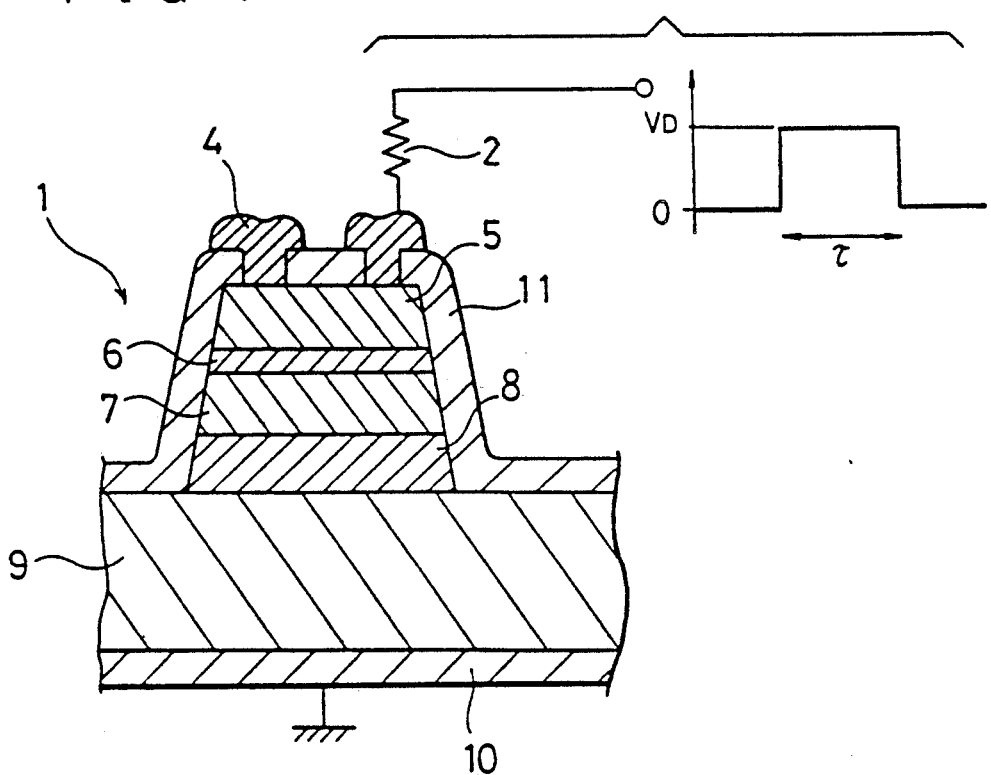
FIG. 1 is a cross-section of an optical logic element for analog threshold value processing according to a first embodiment of the present invention.

FIG. 1 shows an optical logic element for analog threshold value processing according to a first embodiment of the present invention. In FIG. 1, reference numeral 1 denotes an optical switch comprising a pnpn structure semiconductor element. Reference numeral 2 denotes a resistor. Reference numeral 9 denotes a substrate. An n type wide energy band gap layer 8, a p type narrow band gap layer 7, an n type narrow band gap layer 6, and a p type wide band gap layer 5 are successively disposed on the substrate 9. An electrode 10 is disposed on the rear surface of the substrate 9. An electrode 10 is disposed on the rear surface of the substrate 9. An annular electrode 4 is disposed on the p type wide band gap layer 3. Reference numeral 11 denotes an insulating layer.

The device will operate as follows.

Figure 2:
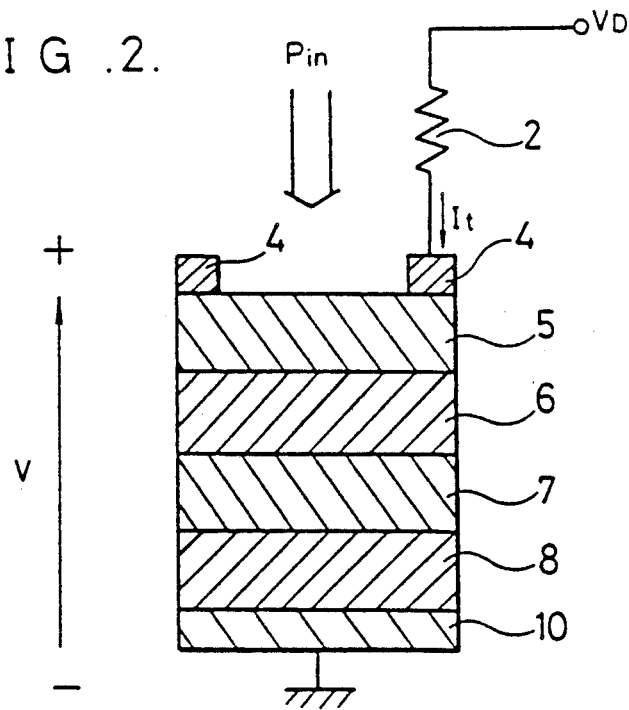
FIG. 2 is a diagram showing an electrical equivalent model of FIG. 1.
Figure 3:
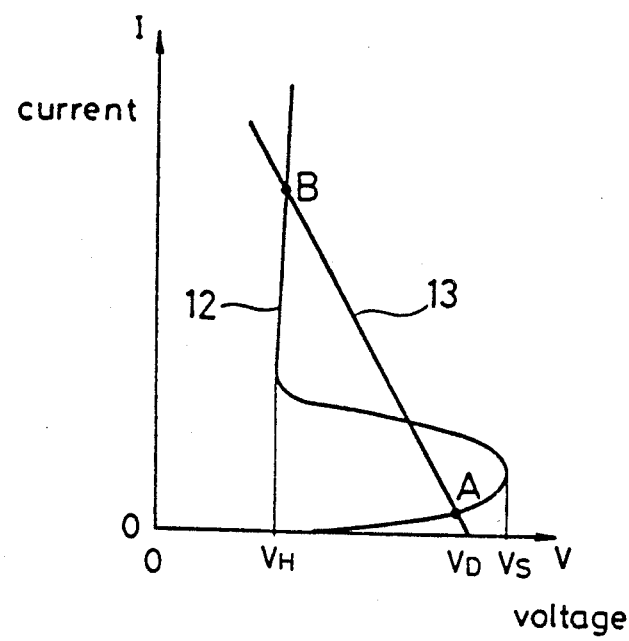
FIG. 3 is a graph of the current versus voltage characteristics of the pnpn structure optical switch shown in FIG. 1.

At first, the operation of pnpn structure semiconductor element 1 will be described. FIG. 2 is a diagram showing an electrically equivalent model of FIG. 1. When the pnpn structure semiconductor element 1 is electrically isolated, the pnpn structure shows a current (I) versus voltage (V) characteristics as shown by the curved line 12 in FIG. 3 due to its thyristor structure. This I - V characteristics 12 includes an off state portion of high resistance, on state portion of low resistance, and a negative resistance portion connecting the on and off state portions. In FIG. 1, when the n type narrow band gap layer 6 or the p type narrow band gap layer 7 is quite thin, the double hetero structure, in the on state, can emit light efficiently. In FIG. 3, $V_S$ is a switching voltage of the pnpn structure semiconductor element. For example, the switching voltage $V_S$ is 4 V.

Figure 4:
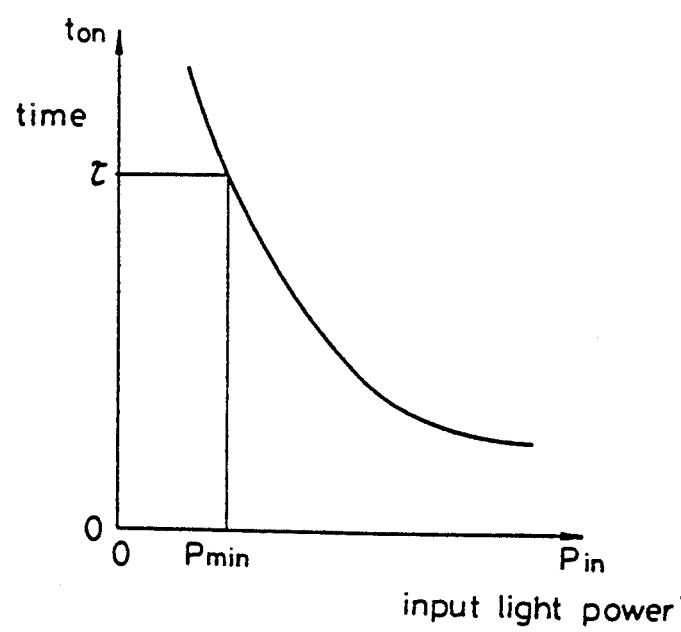
FIG. 4 is a graph of the switch-on time versus input light power characteristics of the optical logic element of FIG. 1.

The performance curve 13 of the entire circuit of FIG. 2 is represented by;

$$V_D = V + I_t R$$

where $V_D$ is a bias voltage (for example, 3.5 V), R is a resistance value of the resistor 2 (for example, 50Ω), and V is a voltage applied to the pnpn structure. The intersections points A and B of the curves 12 and 13 are stable operation points. At first, the operation point exists at the off state A, where a current hardly flows, thereby resulting in no light emission. On the other hand, when external light exceeding a predetermined threshold is incident on the element, the element is turned on and reaches point B, whereby a relatively large current flows and the pnpn structure semiconductor element emits light. As shown in FIG. 4, the time $t_{on}$ for switching from point A to point B becomes shorter as the input light power $P_{in}$ becomes larger. When the bias voltage is made zero, the pnpn structure is turned off resulting in no light emission.

Figure 5:
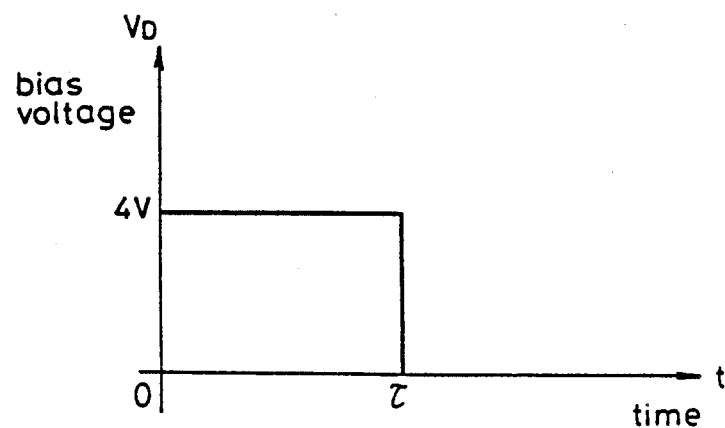
FIG. 5 is a graph of the bias voltage of the optical logic element of FIG. 1.

The analog threshold processing operation will be described. A pulse of width $\tau$ as shown in FIG. 5 is applied as bias voltage, and at the same time, incident light (power $P_{in}$) is input. In this case, when the input light power corresponds to a switch-on time less than $\rho$, i.e., when $P_{in}$ is greater than $P_{min}$ in FIG. 4, the pnpn structure semiconductor element 1 is switched on and emits light. The light emitted has a constant power $P_{out}$ regardless of the value of $P_{in}$. On the contrary, when $P_{in}$ is smaller than $P_{min}$, the element does into emit light.

Next, the relation between input light energy $E_{in}$ and output light energy $E_{out}$ will be described in the following.

Figure 6:
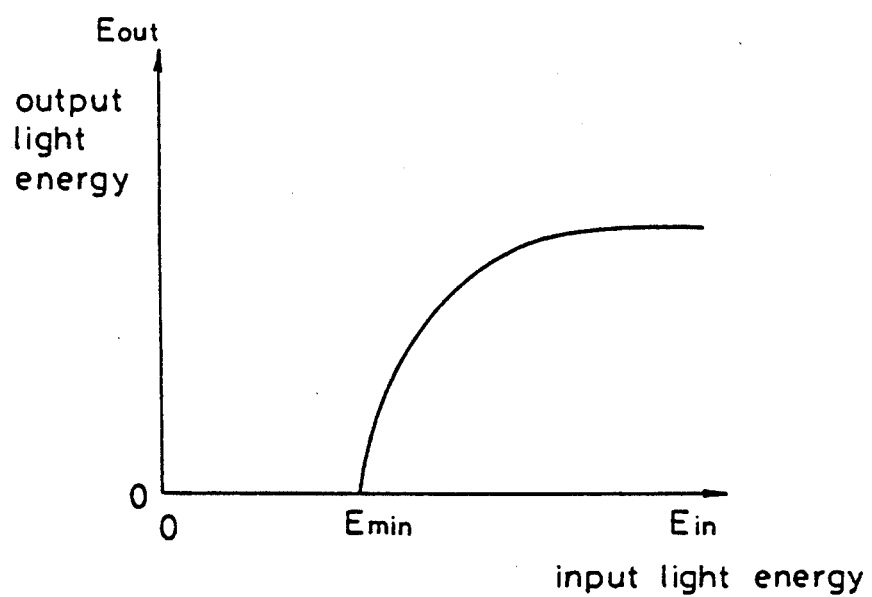
FIG. 6 is a graph of the input versus output light energy characteristics of the optical logic element of FIG. 1.

$E_{in}$ is represented by $P_{in} \times \tau$. Suppose that $E_{min}$ is equal to $P_{min} \times \tau$, when $E_{in}$ is smaller than $E_{min}$, the element does not emit light and $E_{out}$ is equal to 0. On the other hand, when $E_{in}$ is larger than $E_{min}$, the element is switched on to emit light and $E_{out}$ is equal to $P_{out} \times (\tau - t_{on}(P_{in}))$. Herein, $t_{on}(P_{in})$ is a function in FIG. 4. When the above-described relation is plotted with respect to $E_{in}$ and $E_{out}$, a relation shown in FIG. 6 is obtained. Thus, optical threshold processing having an analog output is realized.

In this embodiment, since the element has a simple construction, it is appropriate for integration and high speed operation is achieved. Furthermore, since the input and output quantities of this element are light and light has a property of spatial parallelism, it is appropriate for parallel processing of neural network. Furthermore, the form of the threshold value function can be easily changed by changing the pulse width $\tau$ of the bias voltage.

While in the above-illustrated embodiment a pnpn structure semiconductor element is used, any optical bistable element capable of switching from a high resistance state to a low resistance state in response to light energy and having a switching time which becomes shorter as the input light power becomes larger, may be used.

Figure 7:
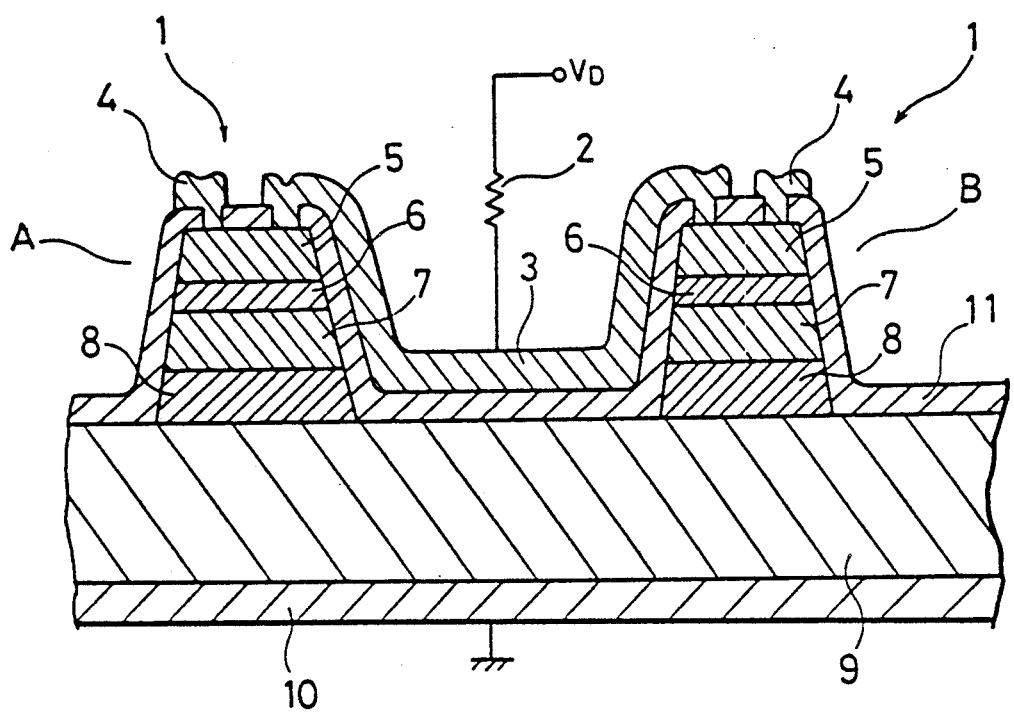
FIG. 7 is a cross-section of a differential type optical logic element according to a second embodiment of the present invention.
Figure 8:
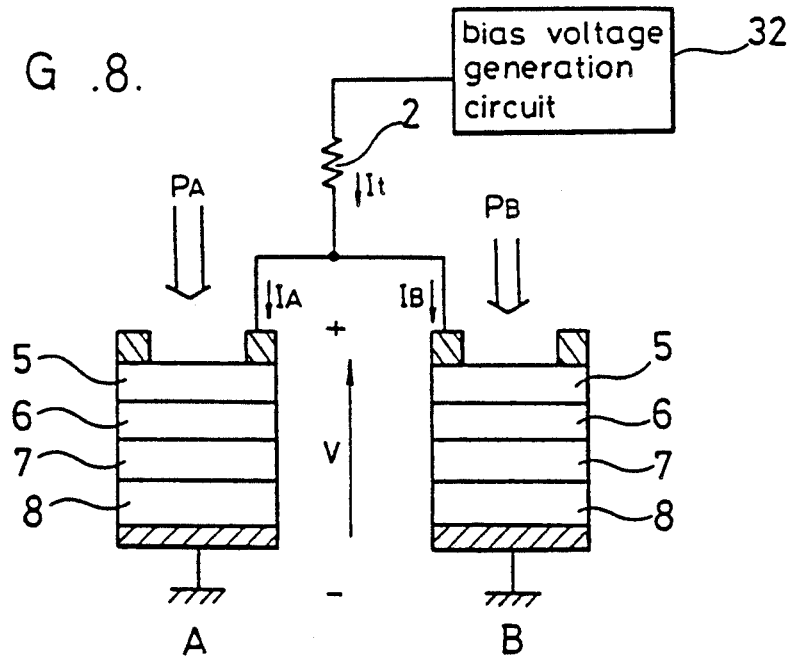
FIG. 8 is a diagram showing an electrical equivalent model of FIG. 7.

While in the above described embodiment the optical logic element is one pnpn structure optical switch, it may be constructed by two pnpn structure optical switches connected in parallel. In this case, differential light threshold processing is obtained. FIG. 7 shows an optical logic element for differential light threshold processing according to a second embodiment of the present invention, where an optical switch 1 comprises two pnpn structure semiconductor elements connected in parallel. In FIG. 7, the same reference numerals denote the same elements as those shown in FIG. 1, and reference numeral 3 denotes a grounding electrode. FIG. 8 shows an electrically equivalent model of FIG. 7. In FIG. 8, reference numeral 32 denotes a bias voltage generating circuit. Two pnpn structure semiconductor elements A and B are connected with each other by an upper electrode, and they are connected to the driving voltage $V_D$ via a resistor 2. The upper electrodes of the respective pnpn structure semiconductor elements are annular for receiving light $P_A$ and $P_B$, respectively.

The device will operate as follows.

Figure 9:
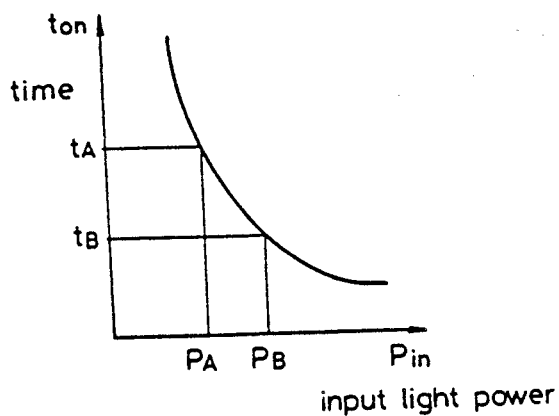
FIG. 9 is a graph of the switch-on time versus input light power characteristics of the differential type optical logic element of FIG. 8.
Figure 10:
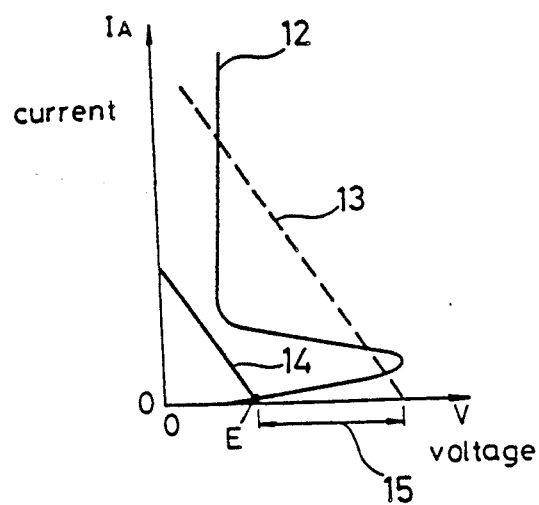
Figure 11:
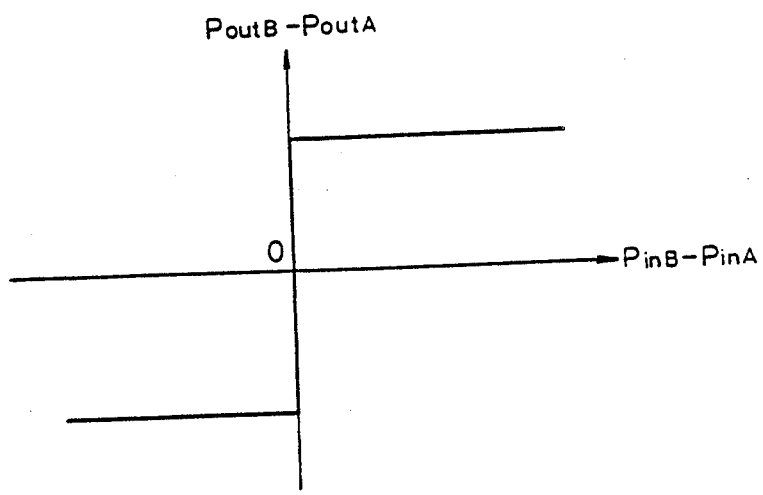
FIG. 11 is graph of the input versus output characteristics the differential type optical logic element of FIG. 8.

A pulse bias voltage shown in FIG. 5 is applied via the resistor 2. At the same time, incident light pulses $P_A$ and $P_B$ are input to the pnpn structure semiconductor elements A and B, respectively, from above. When the input power $P_b$ is larger than $P_A$, the switch-on time $t_A$ and $t_B$ are related by $t_a > t_B$ as shown in FIG. 9, and the element B is first switched on. When the element B is switched on, a voltage drop $I_B R$ occurs at the resistor 2 due to the current $I_B$ flowing through element B. Then, as shown in FIG. 10, the operation curve shifts from 13 to 14, where the curve 13 is represented by $V_D = I_A R + V$, while the curve 14 is represented by $V_D - I_B R = I_A R + V$. The curve 12 and the curve 14 cross with each other only at point E, and therefore, the element A cannot be switched on. Thus, the element with larger input light power is switched, and a differential type light switching operation is obtained as shown in FIG. 11.

FIGS. 12(a) to 12(d) show a producing the differential type optical switch of FIG. 7.

Figure 12A:
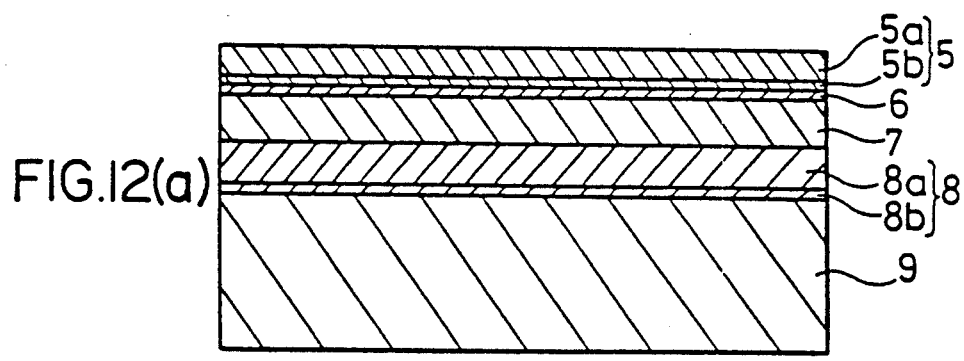
FIGS. 12(a) to 12(d) are cross-sectional views showing respective production process steps for producing the differential type optical logic element of FIG. 8.

First of all, as is shown in FIG. 12(a), an n type wide energy band gap layer 8 comprising n type GaAs 8b of 0.1 micron thickness having an impurity concentration of $5 \times 10^{18}$ cm$^{-3}$ and n type Ga$_{0.6}$Al$_{0.4}$As 8a of 0.5 microns thickness having an impurity concentration of $1 \times 10^{17}$ cm$^{-3}$, a p type narrow band gap layer 7 comprising a p type GaAs of 0.5 microns thickness having an impurity concentration of $1 \times 10^{17}$ cm$^{-3}$, an n type narrow band gap layer 6 comprising an n type GaAs of 5 nm thickness having an impurity concentration of $5 \times 10^{18}$ cm$^{-3}$, and a p type wide band gap layer 5 comprising a p type Ga$_{0.6}$Al$_{0.4}$As 5b of 40 nm thickness having an impurity concentration of $1 \times 10^{19}$ cm$^{-3}$ and a p type GaAs 5a of 0.4 microns thickness having an impurity concentration of $1 \times 10^{19}$ cm$^{-3}$, are successively deposited on an n type GaAs substrate 9 by a molecular beam epitaxy, thereby producing a pnpn structure.

Figure 12B:
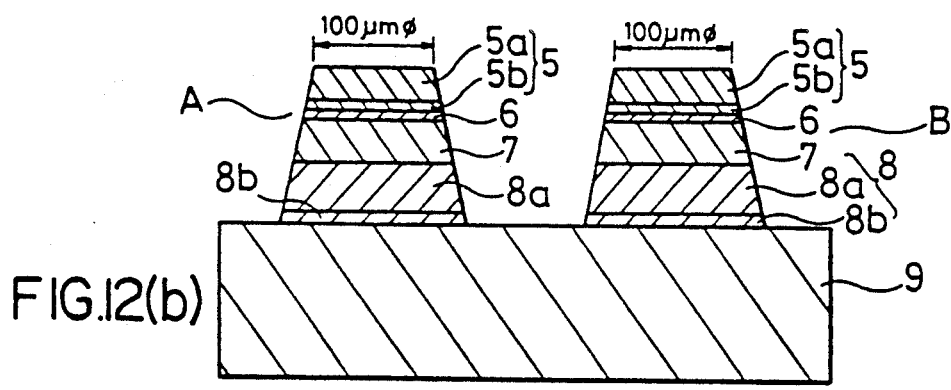

Next, as shown in FIG. 12(b), patterning are formed by photolithography, and thereafter, the layers are etched until the substrate 9 is reached with using a sulfuric acid series etchant, thereby producing two mesa pnpn structure semiconductor elements each 100 microns in diameter.

Figure 12C:
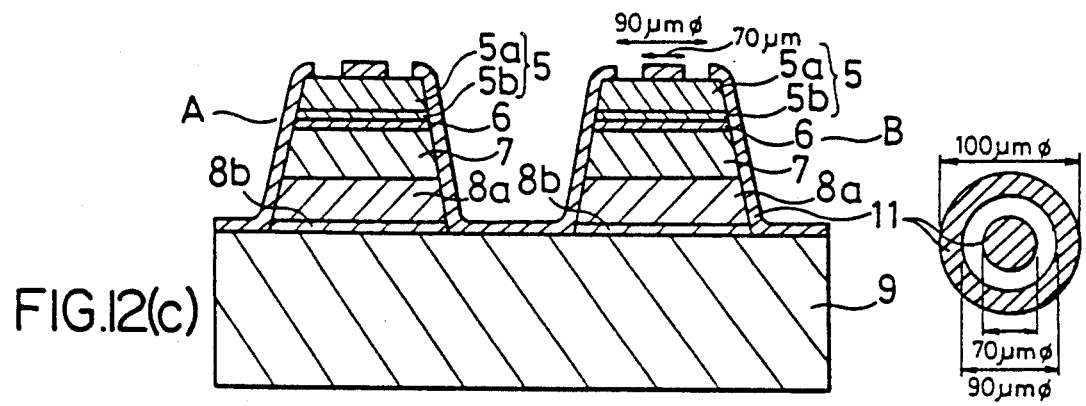

Next, as shown in FIG. 12(c), an insulating film 11 comprising SiO$_2$ is deposited to a thickness of 1400 Angstroms by a plasma CVD method, and a pattern is formed by photolithography, as shown in the right diagram of FIG. 12(c), an aperture for producing an electrode is produced by etching using hydrofluoric acid.

Figure 12D:
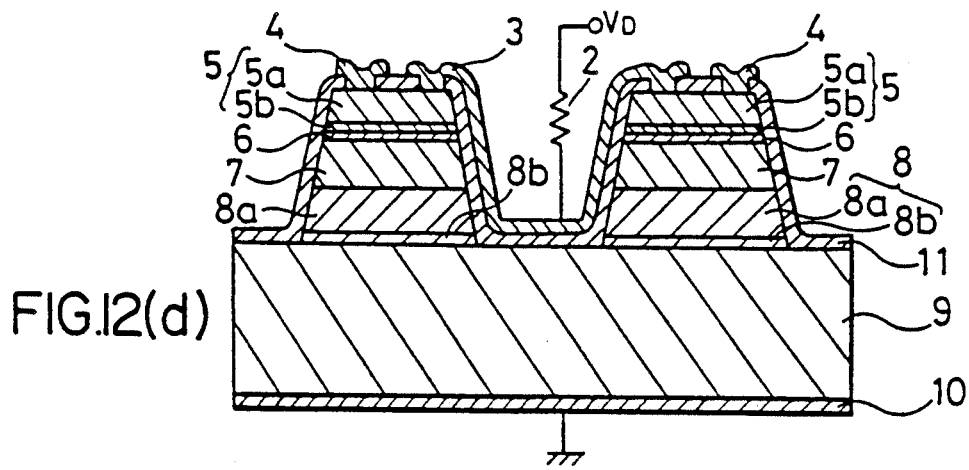

Subsequently, as is shown in FIG. 12(d), after a patterning by photolithography, a Cr(200 Angstroms)/Au (3000 Angstroms) layer is evaporated, thereby producing an upper electrode 3 and an annular electrode 4. Furthermore, an AuGe(200 Angstroms)/NI(50 Angstroms)/Au (3000 Angstroms) layer is deposited on the lower surface of the substrate 9 by evaporation, thereby producing a lower electrode 10.

Lastly, the upper electrode 3 is connected with the bias voltage $V_D$ via the resistor R2, and the lower electrode 10 is connected with ground, thereby completing a light switch.

Figure 21:
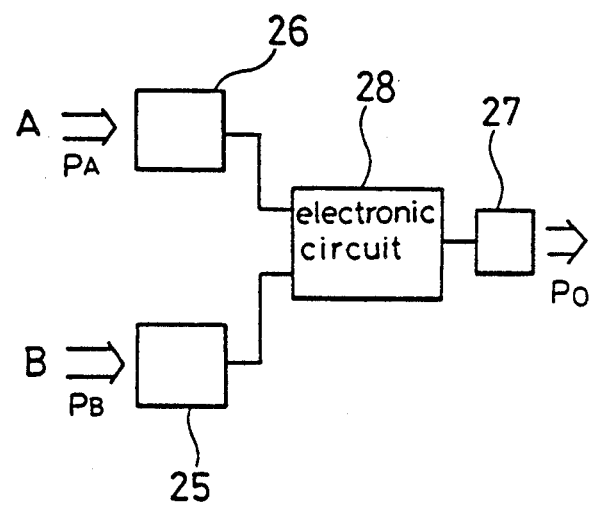
FIG. 21 is a block diagram a prior art differential type optical switch.

A prior art differential type optical switch is shown in fIG. 21 for explaining an effect of the present invention. FIG. 21 shows a prior art differential type optical switch, disclosed in pp 1469 to 1475 of "Applied Optics, vol. 24, No. 10 (1985)". In the figure, reference numerals 25 and 26 denote photodetectors, reference numeral 28 denotes an electronic circuit for threshold processing and amplification, and reference numeral 27 denotes a light emitting diode.

Figure 22:
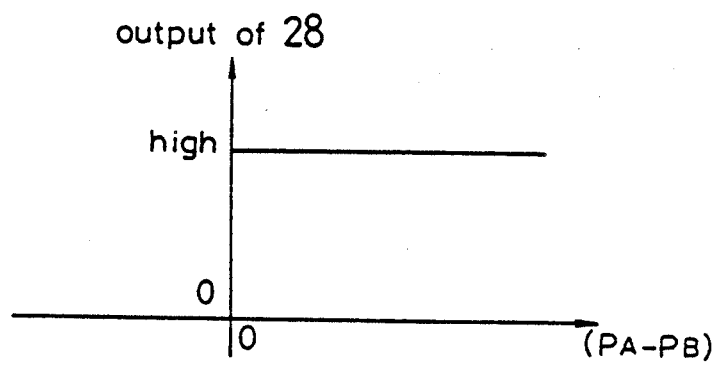
FIG. 22 is a graph of the input versus output characteristics of a prior art optical switch.

This device operates as follows. When the photodetectors 25 and 26 receive the input light B and A of input power $P_B$ and $P_A$, respectively, the relation between the light input and the output of the electronic circuit 28 is as shown in FIG. 22. When the input power $P_A$ is larger than $P_B$, the output of electronic circuit 28 is at high level, and when the input power $P_A$ is smaller than P_B, the output is at zero level. The light emitting diode 27 emits light only when the output of electronic circuit 28 is at high level. A differential type optical switching operation is thus obtained. The electronic circuit 28 has an amplifying function to make the output light larger than the input light.

In the prior art differential type optical switch of such a construction, the optical switch includes quite a large number of parts and is not appropriate for integration. Furthermore, although the response speed of each electronic element accompanying movement of carriers is sub-nanosecond, the prior art optical switch in combination of a plurality of such elements has a lowered response speed, thereby resulting in difficulty in obtaining high speed operation.

In the above-described second embodiment, since the differential switching operation is realized by a simple construction in which two pnpn structure semiconductor elements as optical bistable elements are connected in parallel and these elements are connected with a resistor in series, monolithic integration of elements is easily realized. Furthermore, the elements are switched on with a relatively low input power and a relatively large current flows to generate a large light output in the on state, thereby achieving amplification. Furthermore, since the element includes a relatively small number of parts, a sub-nanosecond response speed is possible, thereby improving the switching speed to a great extent.

While in the above-illustrated embodiment two pnpn structure semiconductor elements are connected in parallel, three or more elements may be connected in parallel. In this case, similarly as in the above-described embodiment, only the pnpn structure semiconductor element having the largest input power is switched on to generate light.

While in the above-illustrated embodiment a pnpn structure semiconductor element is adopted, any light bistable element capable of switching from a high resistance state to a low resistance state in response to light energy and having a switching time which becomes shorter as the input light energy becomes larger may be used.

Since the optical logic elements of the above-illustrated first and second embodiments can input and output light having a property of spatial parallelism, they are appropriate for the two-dimensional optical information processing, such as in the hardware of a neural network.

A driving method of the differential type light switch of FIG. 7 according to a third embodiment of the present invention will be described in the following.

Figure 15:
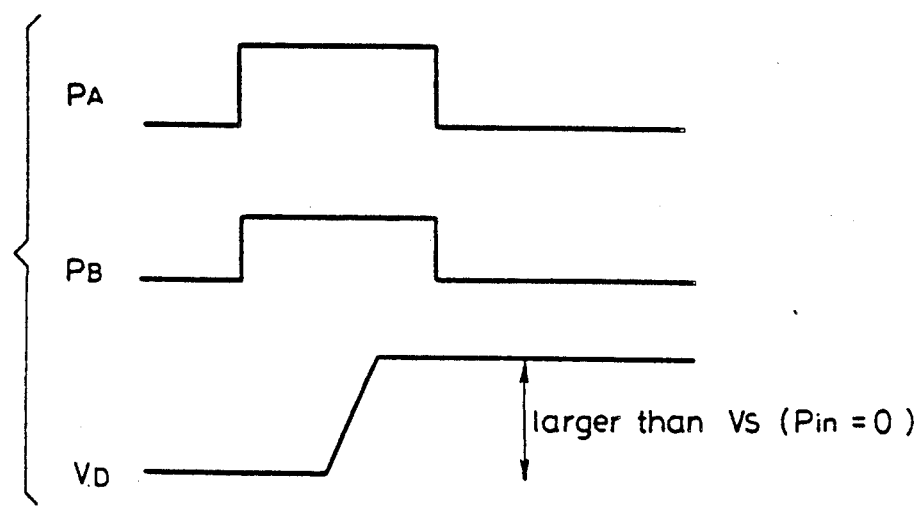
FIG. 15 is a diagram showing operational timing of the differential type optical logic element of FIG. 7.
Figure 16:
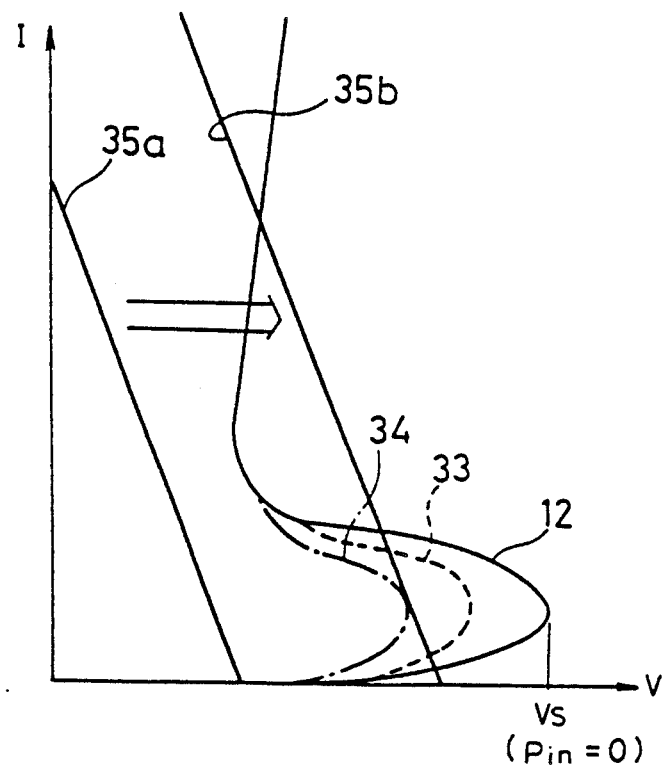
FIG. 16 is a graph of the dependence on input power of the current versus voltage characteristics of the pnpn structure of the differential type optical logic element of FIG. 7.
Figure 17:
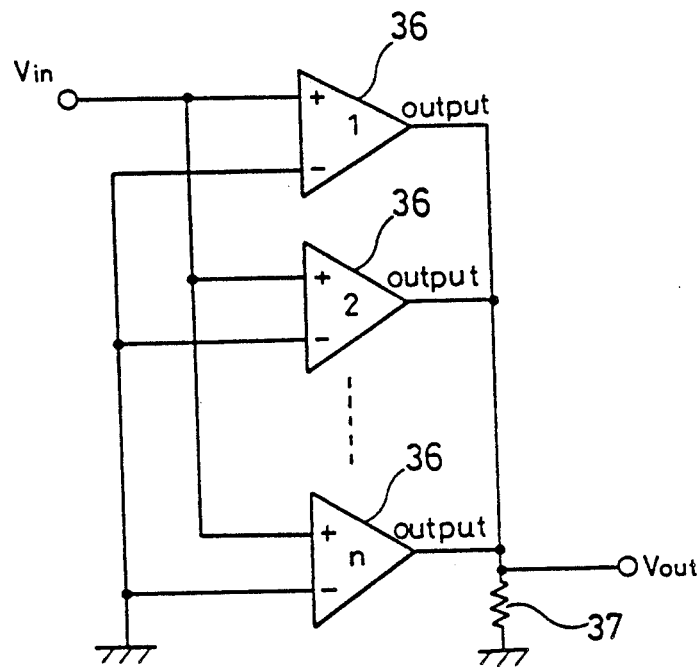
FIG. 17 is a circuit diagram of a prior art optical logic element for analog threshold value processing.
Figure 18:
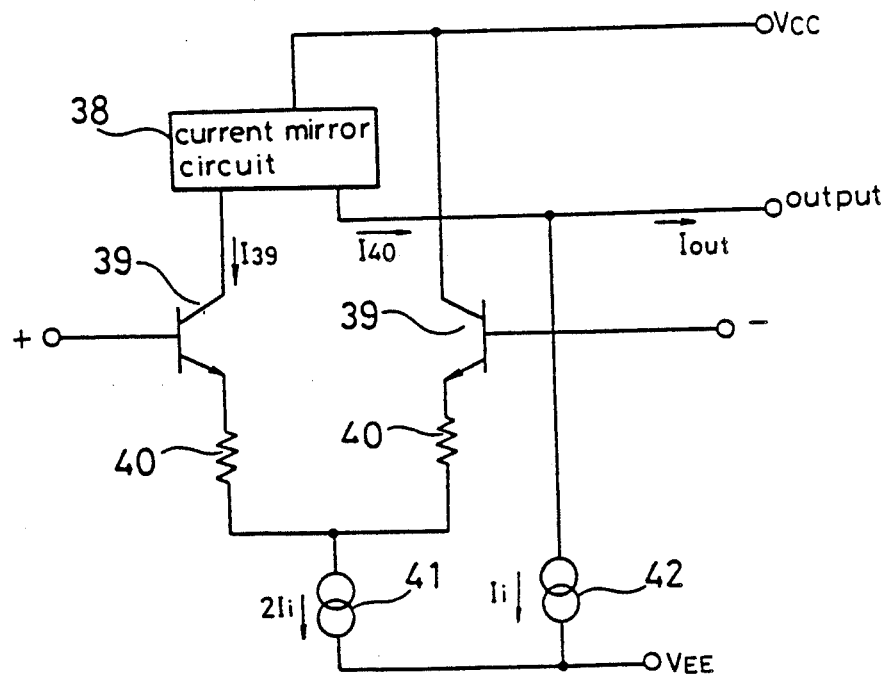
FIG. 18 is a circuit diagram of a current output type differential amplifier.
Figure 19:
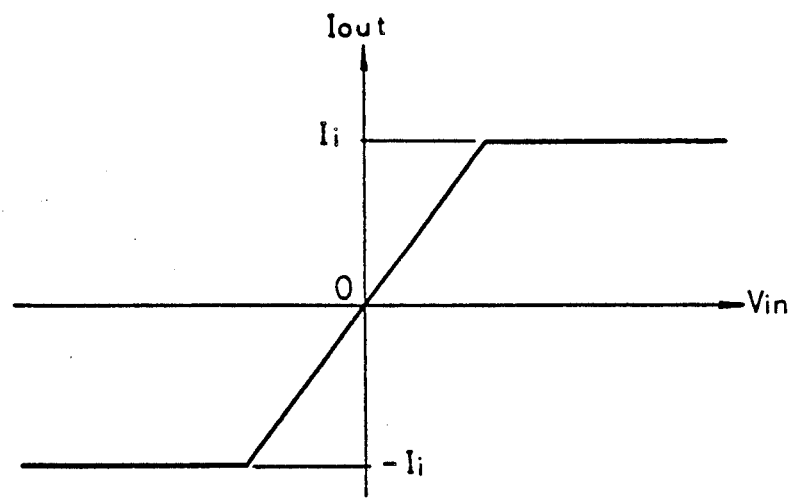
FIG. 19 is a graph of the input versus output characteristics of a differential amplifier.
Figure 20:
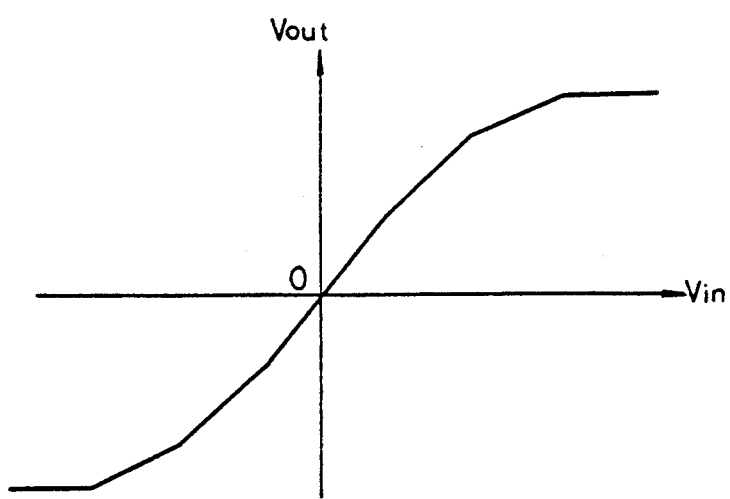
FIG. 20 is a graph of the input versus output characteristics of a prior art logic element.

FIG. 15 shows a timing chart of differential switching operation. In the pnpn structure, when the input light is 0, current(I) versus voltage(V) characteristics represented by curve 12 of FIG. 16 is obtained. Then, the switching voltage is represented by $V_s$ (Pin=0). Next, I-V characteristics when light is input is considered. When light is input, the switching voltage $V_s$ is reduced, and then the larger the input light power is, the larger the reduction of the voltage is. When the light power input to the pnpn structure elements A and B are $P_A$ and $P_B$, respectively, and $P_A$ is larger than $P_B$, the I-V characteristics of element A is represented by curve 34 and the I-V characteristics of element B is represented by curve 33, respectively. In this state, the bias voltage $V_D$ applied by the bias voltage generating circuit 32 is raised from 0 to $V_S$ (Pin=0). Then, the operation curve of the entire circuit of FIG. 8 is represented by $$V_D = I \cdot R + V, \tag{1}$$

and this is represented by the straight line 35a in FIG. 16. As the $V_D$ becomes larger, the straight line 35a is shifted to right, and when the straight line 35a exceeds the straight line 35b, the pnpn structure element A is switched on. Once the element A is switched on, a large current flows through element A and a voltage drop occurs at the resistor R, thereby lowering the voltage V applied to the parallel circuit elements A and B. As a result, element B is never turned on. On the contrary, when $P_A$ is smaller than $P_B$, only the element B is switched on. Thus, differential light switching operation is obtained.

In this embodiment, since the switching itself is electrical and results from the reduction of the switching voltage of the respective pnpn structure elements, the energy range of the input light energy can be made quite low. Furthermore, even when the input light power is low, the switching response does not become slow.

While in the above-illustrated embodiment two pnpn structure semiconductor elements are connected in parallel, three or more elements may be connected in parallel. In this case, similarly as in the above-described embodiment, only the pnpn structure semiconductor element having the largest input power is switched on to generate light. This switching operation is also conducted in quite a small range of input light energy.

A parallel information processing system utilizing the pnpn structure semiconductor element 1 of the first and second embodiments will be described in the following.

Figure 13:
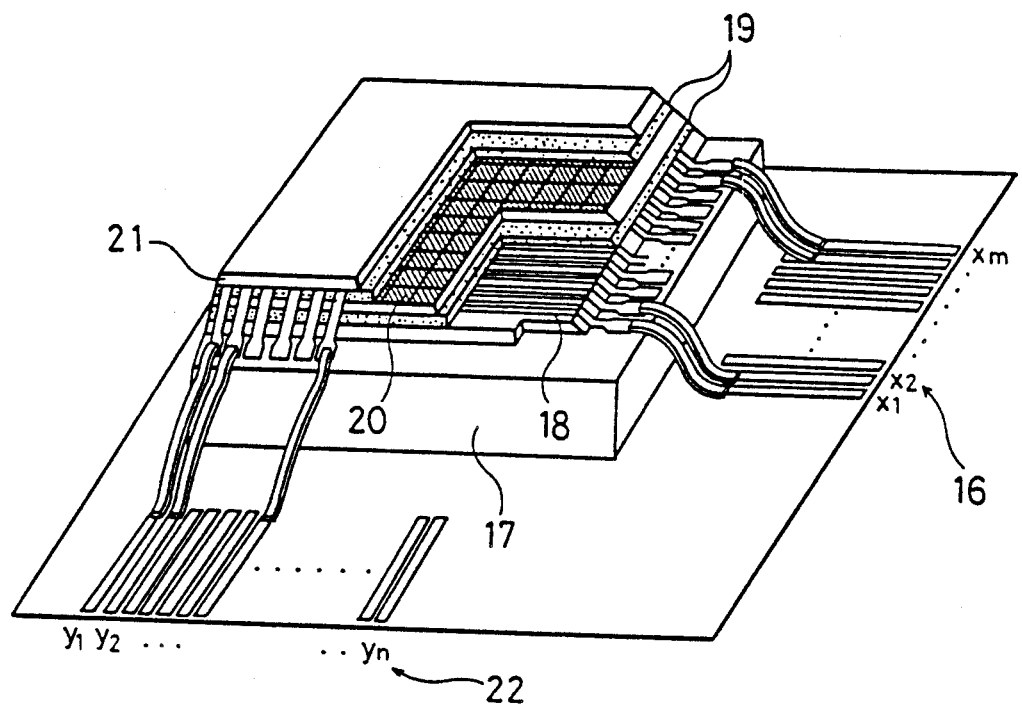
FIG. 13 is a partially cut away perspective view of an opto-electronic conversion apparatus according to a fourth embodiment of the present invention.
Figure 14:
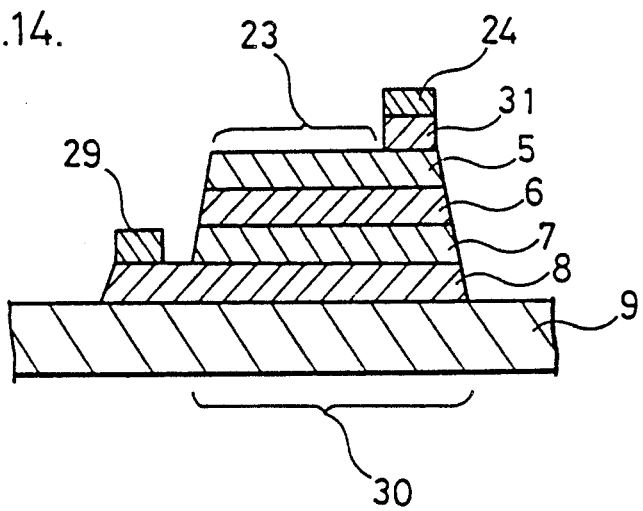
FIG. 14 is a cross-section of a pnpn optical memory of the opto-electronic conversion apparatus of FIG. 13.

FIG. 13 is a diagram showing an opto-electronic conversion device according to a fourth embodiment of the present invention. FIG. 14 shows a sectional view of a pnpn structure optical memory of FIG. 13. In these figures, reference numeral 16 designates input terminals $(x_1, \ldots, x_m)$. Reference numeral 17 designates a GaAs substrate. A linear light emitting diode (LED) array 18 is disposed on the GaAs substrate 17. An insulating film 19 is disposed on the light emitting diode 17. A two-dimensional matrix array 20 ($M_{ik}$: $1 \leq i \leq m, 1 \leq k \leq n$) of pnpn optical memories is disposed on the insulating film 19. A linear photo detector (PD) array 21 is disposed on the matrix array 20 via insulating film 19. Reference numeral 22 denotes output terminals $(y_i, \ldots, y_n)$. Reference numeral 9 denotes a substrate. An n type energy band gap layer 23 is disposed on the substrate 9. A p type narrow energy band gap layer 7 is disposed on the n type wide energy band gap layer 8. An n type narrow energy band gap layer 6 is disposed on the p type narrow energy band gap layer 7. A p type wide energy band gap layer 5 is disposed on the n type narrow energy band gap layer 6. A negative side electrode 29 is disposed on the n type wide energy band gap layer 8. A load resistance layer 31 is disposed on the p type wide energy band gap layer 5. A positive side electrode 24 is disposed on the load resistance layer 31. Reference numerals 23 and 30 denote a light output portion and a light input portion, respectively.

This device will operate as follows.

First of all, as shown in the current versus voltage characteristics curve 12 of FIG. 3, the operation of a pnpn optical memory has an off state of high impedance and an on state of low impedance, and because this element is of double hetero structure, it emits light efficiently in the on state. Herein, the switching voltage $V_S$ is 4 V and the holding voltage $V_H$ is 2 V. When a voltage a little lower than $V_S$ (for example, 3.5 V) is applied to the element, the optical memory is first in the off state. When light greater than a predetermined threshold value is input to the optical memory, it switches to the on state. Even when the applied voltage is made 0, this on state is held for a predetermined time (for example, 100 $\mu$sec) due to the effects of remaining carriers. Therefore, if a voltage of $V_H$ is applied for a predetermined period (for example, a pulse of 0.1 $\mu$s width per every 10 $\mu$s) as a refresh pulse, the on state is held. Furthermore, this on state information can be read out as a light output at an arbitrary time by applying a voltage a little lower than $V_S$.

Next, the principle of operation of the opto-electronic conversion device will be described. The input signal is input to the m input terminals 16 ($x_1, \ldots, x_m$) in parallel. As the input, the signal of input terminal $x_i$ ($1 \leq i \leq m$) which receives binary digital signals, i.e., a0 or a1 is sent to the output terminal $y_k$ ($1 \leq k \leq m$). The input terminal $x_i$ drives i-th line LED, and the output light is received by the optical memories ($M_{i1}, \ldots, M_{in}$). When a voltage a little lower than $V_S$ is applied to the $M_{iK}$, i-th LED is emitted and $M_{iK}$ is switched on if $x_i$ is "1". On the other hand, $M_{iK}$ is kept in the off state if $x_i$ is "0".

Thus, "1" and "0" of $x_i$ are memorized as on or off for $M_{iK}$. As described above, after the memorization, the information is maintained by the refresh pulse. When a voltage a little lower than $V_S$ is applied to $M_i$ at an arbitrary time when data is to be read out, if the memorized information is "1", it emits light, and the output light is received by the k-th PD, and "1" is sent to the output terminal $y_k$. On the other hand, if the memorized information is "1", it does not emit light and a signal "0" is sent to $y_k$.

Figure 23:
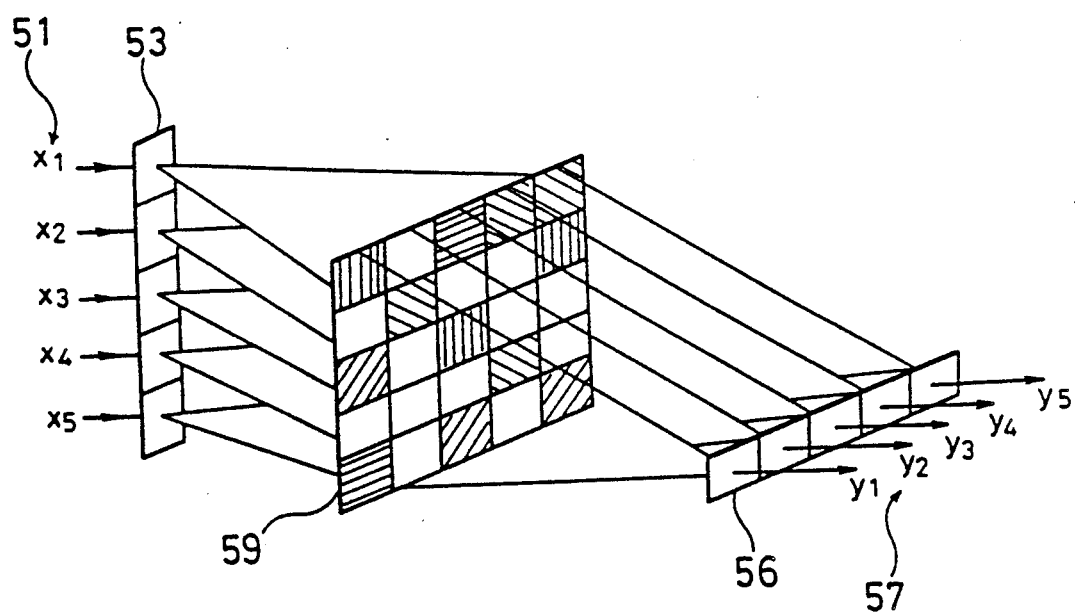
FIG. 23 is a diagram of the construction of a prior art opto-electronic conversion apparatus.

FIG. 23 is a diagram showing a prior art opto-electronic conversion device disclosed in pp 1469 to 1475 of "Applied Optics, vol. 24, No. 10 (1985)". In FIG. 23, reference numeral 51 denotes input terminals ($x_1, \ldots, x_5$). Reference numeral 53 denotes an LED array. Reference numeral 59 denotes a spatial optical modulator two-dimensional array ($M_{ik}$, $1 \leq i$, $k \leq 5$). Reference numeral 56 denotes a PD array. Reference numeral 57 denotes output terminals ($y_1, \ldots y_5$).

This device will operate as follows. The signal input to the terminal $x_1$ drives the first LED, and the output light is input to the five spatial optical modulators ($m_{11}, \ldots, M_{15}$). When the terminal $y_2$ is connected to the signal $x_1$, only the modulator $M_{21}$ is set at light permeable state. Thus, opto-electronic conversion is realized. However, in the opto-electronic conversion device of such construction, because the spatial optical modulator has no memory function, opto-electronic conversion between the time sequentially input signals is not realized. Furthermore, because the individual optical elements are spatially arranged, there is a problem in stability and miniaturization.

The opto-electronic conversion device of the present embodiment shown in FIG. 13 includes a line LED array, a two-dimensional pnpn optical memory array, and a line PD array all laminated together. Therefore, a signal from an arbitrary input terminal is sent to an arbitrary output terminal at an arbitrary time, and opto-electronic conversion is random in both space and time sequence for sequentially input signals. Furthermore, since the device is integrated on a substrate, a miniaturized and stable device can be obtained at low cost. Since the pnpn optical memory has a threshold light input, an improvement in S/N ratio can be achieved.

In the above-illustrated embodiment the opto-electronic conversion device in which the signals which are input to the input terminals $x_1, \ldots, x_m$ are m scalar signals. However, when $x_1, \ldots, x_n$ correspond to the vector components of vector $x = (x_1, \ldots x_n)$ and n is made equal to m, an optical vector operation unit can be achieved. When the vector is time sequentially input and memorization and reading-out are conducted similarly to conversion, the interchanging and shifting of the vector components can be achieved. Furthermore, when $M_{ik} \ldots M_{uk}$ are read out at the same time, the sum thereof appears at the k-th output terminal, and when the sum signal is passed through the threshold value element, AND/OR logic functions can be performed. These arithmetic operations can be conducted in n (=m) parallel operations, thereby realizing a vector operation.

As is evident from the foregoing description, according to the present invention, an optical logic element includes an optical bistable element having a switching time from the off state with a small light output to the on stage of large light output which becomes shorter as the input light energy becomes larger. Analog threshold processing is achieved as a function of input light energy by making the operation time range of the light bistable element a fixed value. Therefore, the optical logic element can be realized with relatively few parts and high speed operation appropriate for integration can be realized. Furthermore, the element can be easily produced at a low cost. Furthermore, because the input and output light has a property of spatial parallelism, the device can be easily applied to the hardware a neural network.

According to a second aspect of the present invention, a differential type optical switch is provided with a plurality of optical bistable elements connected in parallel and a resistor connected with the plurality of optical bistable elements, thereby enabling a differential threshold value processing. Accordingly, the device can be made with relatively few parts, and a high integration and high speed operation can be realized. Since line is input and output to the device in a direction perpendicular to the wafer surface, the device is appropriate for two-dimensional optical information processing.

According to a third aspect of the present invention, a plurality of pnpn structure elements are connected with each other in parallel and a resistor is connected in series with the elements, and the differential switching is electrically achieved by applying light, thereby narrowing the energy range of input light required for switching. Thus, a plurality of optical switches can be connected and a high performance optical information processing system can be realized. Furthermore, high speed operation and lowering of power consumption of the entire system can be realized.

According to a fourth aspect of the present invention, an opto-electronic conversion device includes a linear LED array, a two-dimensional array of optical bistable elements such as pnpn optical memory elements, and a linear PD array arranged transverse the LED array. Therefore, conversion between signals which are input time sequentially can be conducted. The device is integrated on a substrate, and a miniaturized and stable device can be obtained at low cost. Furthermore, the optical bistable element has a threshold value processing function against the light input, and an improvement of S/N ratio can be expected. This opto-electronic conversion device can be applied to an optical vector operation device.

What claimed is:

1. An optical logic element comprising:
an optical bistable element for switching from a high resistance state to a low resistance state in response to incident light energy in which the switching time becomes shorter as the incident light energy becomes larger; and
said optical logic element achieving analog threshold processing of said light energy by making the operation time range of said optical bistable element a finite value.

2. An optical logic element comprising:
a plurality of optical bistable elements for switching from a high resistance state to a low resistance state in response to incident light energy in which the switching time becomes shorter as the incident light energy becomes larger, the elements being connected in parallel with each other;
an electrical resistor connected in series with said plurality of optical bistable elements; and
said optical logic element achieving differential threshold processing of said light energy.

3. An optical logic element as defined in claim 2, wherein said differential threshold processing is achieved by applying a voltage larger than a switching voltage to said respective optical bistable elements while inputting light thereto.

4. An opto-electronic apparatus comprising:
a linear light emitting element array;
a two-dimensional array of optical memories, each memory comprising an optical bistable element for switching from a high resistance state to a low resistance state in response to incident light energy and having a switching time which becomes shorter as the light energy becomes larger; and
linear light receiving element array arranged transverse to said light emitting element array wherein said light emitting element array, said two-dimensional array of optical memories, and said light receiving array are disposed on each other.

5. An optical logic element comprising:
an n-type semiconductor substrate;
an npnp structure including an n-type relatively wide energy band gap semiconductor layer, a p-type relatively narrow energy band gap semiconductor layer, an n-type relatively narrow energy band gap semiconductor layer, and a p-type relatively wide energy band gap semiconductor layer successively disposed on the substrate, at least one of the p-type relatively narrow band gap layer and the n-type relatively narrow band gap layer being sufficiently thin that the structure emits light when in a relatively low resistance on state; and
a rear electrode disposed on the substrate opposite the npnp structure and a front electrode disposed on the p-type relatively wide band gap layer configured for admitting incident light to the npnp structure whereby the element may be switched from a relatively high resistance off state to a relatively low resistance, light emitting on state by a combination of electrical bias and light incident at the front electrode, the switching time from the off to the on state being shortened as the energy of the incident light increases.

6. An optical logic element comprising:
an n-type semiconductor substrate;
first and second npnp structures commonly disposed on said substrate, each structure including an n-type relatively wide energy band gap semiconductor layer, a p-type relatively narrow energy band gap semiconductor layer, an n-type relatively narrow energy band gap semiconductor layer, and a p-type relatively wide energy band gap semiconductor layer successively disposed on the substrate, at least one of the p-type relatively narrow band gap layer and the n-type relatively narrow band gap layer of each structure being sufficiently thin that each structure emits light when in a relatively low resistance on state; and
a rear electrode disposed on the substrate and first and second front electrodes disposed on the p-type relatively wide band gap layers of the first and second npnp structures for admitting incident light to the first and second structures, the first and second front electrodes being electrically connected together, whereby each npnp structure may be switched from a relatively high resistance off state to a relatively low resistance, light emitting on state by a combination on electrical bias and light incident at the respective front electrodes, the switching time from the off to the on state being shortened as the incident light increases and wherein only the npnp structure receiving the larger energy incident light switches from the off state to the on state.

7. An opto-electronic apparatus comprising:
a semiconductor substrate;
a plurality of generally parallel linear arrays of light emitting elements disposed on said substrate;
a first electrically insulating layer transparent to light emitted by said light emitting elements disposed on said arrays of light emitting elements;
a two-dimensional array of optical elements disposed on said first electrically insulating layer, each optical element including an n-type relatively wide energy band gap semiconductor layer, a p-type relatively narrow energy band gap semiconductor layer, an n-type relatively narrow energy band gap semiconductor layer, and a p-type relatively wide energy band gap semiconductor layer successively disposed on the first insulating layer, at least one of the p-type relatively narrow band gap layer and the n-type relatively narrow band gap layer being sufficiently thin that the optical element emits light when in a relatively low resistance on state, a first electrode disposed on said n-type relatively wide band gap semiconductor layer and a second electrode in electrical communication with the p-type relatively wide band gap semiconductor layer and configured for admitting incident light to the optical element, each of the optical elements being disposed opposite one of the light emitting elements in the plurality of linear arrays of light emitting elements wherein each optical element may be switched from a relatively high resistance off state to a relatively low resistance, light emitting on state by a combination of electrical bias and light incident at the respective front electrode from the corresponding light emitting element;

a second electrically insulating layer disposed on said two-dimensional array and transparent to light emitted by the optical elements disposed on said second electrically insulating layer along a direction transverse to the direction of the linear arrays of light emitting elements, each photo-detecting element being disposed opposite a corresponding optical element of the two-dimensional array for detecting light emitted by the corresponding optical element.

8. The opto-electronic apparatus of claim 7 comprising a resistive film disposed between each of the front electrode and the p-type relatively wide band gap semiconductor layer of the respective optical elements.

9. The opto-electronic apparatus of claim 4 comprising a plurality of generally parallel linear light emitting element arrays, each light emitting element being disposed opposite a corresponding optical memory, and a plurality of generally parallel linear light receiving element arrays arranged transverse to the direction of said light emitting element arrays, each light receiving element being disposed opposite a corresponding optical memory, the light emitting elements and the light receiving elements being disposed on opposite sides of the optical memories.

* * * * *

UNITED STATES PATENT AND TRADEMARK OFFICE
CERTIFICATE OF CORRECTION

PATENT NO. : 4,999,688

DATED : March 12, 1991

INVENTOR(S) : Hara et al.

It is certified that error appears in the above-identified patent and that said Letters Patent is hereby corrected as shown below:

Column 13, line 4, after "elements" insert --in the two-dimensional array;
    a plurality of generally parallel linear arrays of photodetecting elements--.

Column 14, line 1, change "electrode" to --electrodes--.

Signed and Sealed this

Sixth Day of October, 1992

Attest:

DOUGLAS B. COMER

Attesting Officer      Acting Commissioner of Patents and Trademarks